United States Patent
Darmawan et al.

(10) Patent No.: US 6,265,248 B1
(45) Date of Patent: Jul. 24, 2001

(54) METHOD FOR PRODUCING SEMICONDUCTOR-ON-INSULATOR STRUCTURE WITH REDUCED PARASITIC CAPACITANCE

(75) Inventors: Johan Darmawan, Cupertino; Christian Olgaard, Sunnyvale; Tsung Wen Lee, Milpitas, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/307,065

(22) Filed: May 7, 1999

Related U.S. Application Data

(62) Division of application No. 09/187,328, filed on Nov. 6, 1998, now Pat. No. 5,994,759.

(51) Int. Cl.[7] .................................................. H01L 21/84
(52) U.S. Cl. ............................................ 438/155; 438/526
(58) Field of Search ................................... 438/155, 238, 438/526, 533, 620, 967

(56) References Cited

U.S. PATENT DOCUMENTS

| | | | |
|---|---|---|---|
| 5,185,280 | 2/1993 | Houston et al. | 437/44 |
| 5,231,045 | 7/1993 | Miura et al. | 437/62 |
| 5,359,219 | 10/1994 | Hwang | 257/351 |
| 5,429,955 | 7/1995 | Joyner et al. | 437/26 |
| 5,440,161 | 8/1995 | Iwamatsu et al. | 257/349 |
| 5,532,175 | 7/1996 | Racanelli et al. | 437/29 |
| 5,569,538 | 10/1996 | Cho | 428/427 |
| 5,589,407 | 12/1996 | Meyyappan et al. | 437/26 |
| 5,614,433 | 3/1997 | Mandelman | 437/57 |
| 5,616,507 | 4/1997 | Nakai et al. | 438/480 |
| 5,747,829 | 5/1998 | Sakurai et al. | 257/66 |
| 5,795,800 | * 8/1998 | Chan et al. | 438/526 |
| 5,807,771 | * 8/1998 | Vu et al. | 438/526 |

OTHER PUBLICATIONS

Wolf, S., "Silicon Processing for the VLSI Era", vol. 2, pp. 68–78, Lattice Press, Sunset Beach, CA (1990).

* cited by examiner

Primary Examiner—Chandra Chaudhari
(74) Attorney, Agent, or Firm—Skjerven Morrill MacPherson LLP; Edward C. Kwok, Esq.

(57) ABSTRACT

In a SOI structure according to the invention, a substrate region directly adjacent and underlying the buried oxide layer is doped with a dopant having a conductivity type opposite that of the substrate. This produces a junction between the doped layer and the substrate. Appropriately biasing this junction creates a depletion layer, which effectively extends the width of the buried oxide layer deep into the substrate, thereby reducing parasitic capacitance in the SOI structure, particularly for inductors, interconnects, and other passive circuit elements. Reducing parasitic capacitance reduces associated substrate losses and RC propagation delays. These benefits become increasingly important at high frequencies encountered in RF wireless communication and high speed digital applications.

20 Claims, 5 Drawing Sheets

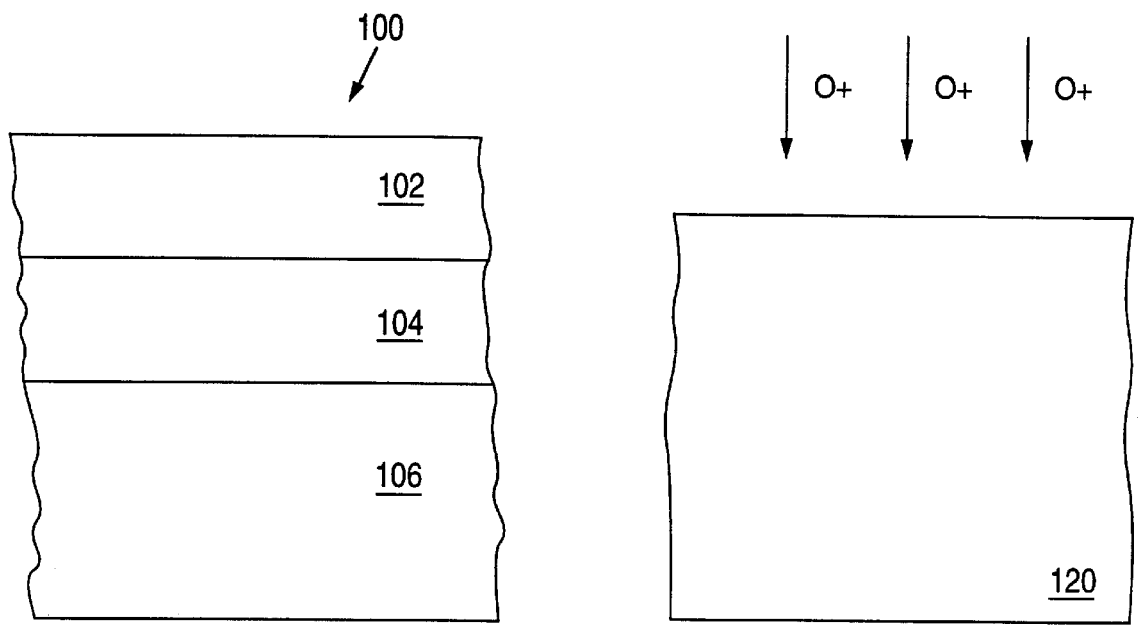
FIG. 1A
(PRIOR ART)
FIG. 1C
(PRIOR ART)
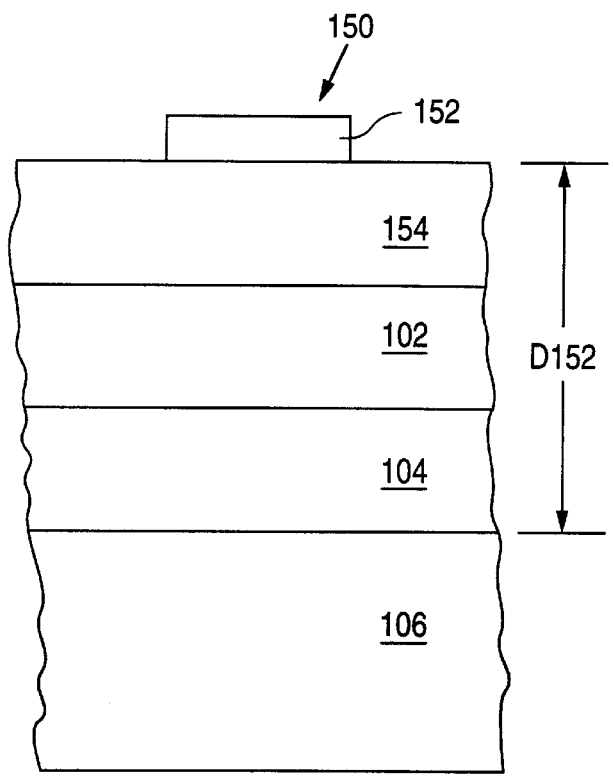
FIG. 1B
(PRIOR ART)
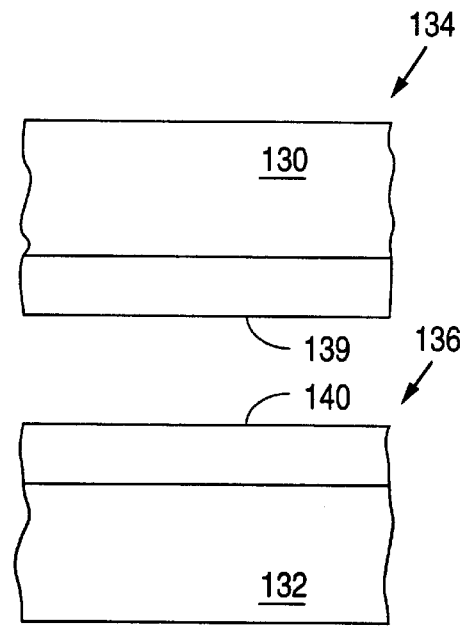
FIG. 1D
(PRIOR ART)

METHOD FOR PRODUCING SEMICONDUCTOR-ON-INSULATOR STRUCTURE WITH REDUCED PARASITIC CAPACITANCE

CROSS REFERENCE TO RELATED APPLICATION

The present application is a divisional application of U.S. application Ser. No. 09/187,328, now U.S. Pat. No. 5,994,759 filed on Nov. 6, 1998.

FIELD OF THE INVENTION

The present invention relates generally to integrated circuit structures and methods for the manufacture thereof, and more specifically to semiconductor-on-insulator integrated circuit structures having reduced parasitic capacitance.

BACKGROUND

Semiconductor-on-insulator (SOI) technology provides several advantages over conventional bulk silicon technology for integrated circuit (IC) structures for radio frequency (RF), low power, and high performance applications. These advantages include reduced processing steps, CMOS circuit latchup elimination, parasitic capacitance reduction for increased speed, improved device isolation, and superior radiation hardness.

FIG. 1A is a cross-sectional view of a conventional SOI structure 100. An active semiconductor layer (device layer) 102 overlies an isolation layer, typically a buried oxide layer 104, which in turn overlies a substrate 106. The thickness of active semiconductor layer 102 for a conventional SOI structure 100 being considered here is generally of the order of less than 400 nm and typically of the order of approximately 200 nm, and the thickness of buried oxide layer 104 is generally less than 1,000 nm and typically of the order of approximately 400 nm. In some conventional SOI structures, substrate 106 has P-type conductivity, whereas in other SOI structures, substrate 106 has N-type conductivity. Similarly, in some SOI structures, active semiconductor layer 102 has P-type conductivity, whereas in other SOI structures, active semiconductor layer 102 has N-type conductivity.

Active semiconductor layer 102 includes active and passive integrated circuit elements, contact regions and interconnects, which are isolated from substrate 106 by buried oxide layer 104. FIG. 1B is a cross-sectional view schematically illustrating a conventional passive element (e.g. conventional inductor 152) in a conventional SOI structure 150. There are numerous methods familiar in the art for forming conventional inductors, capacitors, interconnects, and other passive circuit elements. For example, conventional inductor 152 is typically formed as a two-dimensional masked metal deposition. Normally inductor 152 overlies the uppermost dielectric layer (represented by insulating layer 154) of SOI structure 150, where it is separated from substrate 106 by a distance D152.

Although one motivation for using conventional SOI structures is to reduce parasitic capacitance, parasitic capacitance persists between the substrate and the circuit elements in the active semiconductor layer. In particular, passive circuit elements, e.g. inductors, capacitors, and interconnects, which are dimensionally much larger than typical active devices, are accordingly more susceptible to the effects of parasitic capacitance. Whereas MOS active devices approach sub-0.5-micron ($\mu$m) dimensions, passive devices, for example inductors, are unlikely to become smaller than hundreds of microns. Therefore, in high frequency wireless communication applications where passive circuit elements such as inductors are commonly required, these inductors are typically hundreds of time larger than any MOS active device.

The detrimental consequences of parasitic capacitance affect circuit performance by reducing the "Q" factor of passive components and increasing overall circuit loss. Parasitic capacitance also adds to any design capacitances, thus degrading circuit performance. These problems are particularly significant where the integrated circuit is operated at high frequencies, such as typically encountered in modern RF communication circuits and high speed digital integrated circuits.

For example, wireless RF communication devices are frequently high frequency, compact, and battery-powered. Circuit losses caused by parasitic capacitance increase the power dissipation of these devices. Power dissipation, in turn, increases the battery requirement, which leads to shorter battery life and/or larger batteries, increasing size, weight, cost, and inconvenience.

As a further example, a microprocessor or large memory chip with a high density of long interconnects has significant parasitic capacitance to the substrate, even when using current SOI technology. As future microprocessor clock frequencies increase, circuit losses due to parasitic capacitance will become an increasingly serious limitation. Parasitic capacitance also contributes significantly to RC propagation delay, further limiting microcomputer speed. As present microprocessor clock frequencies are over 300 megahertz and are predicted to reach the one gigahertz range within the next few years, reducing parasitic capacitance is important. Thus, reducing parasitic capacitance in SOI structures employed for RF and other high frequency applications is desirable.

One approach to reducing parasitic capacitance is to increase the distance (for example dimension D152 in FIG. 1B) between the passive circuit element (e.g. inductor 152) and substrate 106. However, as passive circuit elements are typically placed above the uppermost dielectric layer of a circuit (e.g. inductor 152 overlying insulating layer 154 in FIG. 1B), it is impractical to increase distance D152 simply by adding layers. Increasing the thickness of the active layer or existing insulating layers can also increase distance D152 However, as an increase in the active layer thickness will add parasitic capacitance to active devices, and an increase in the thickness of insulating layers will add undesired process complexity, neither of these alternatives is attractive.

A further approach is to increase the thickness of buried oxide layer 104. However, efforts to date have resulted in a maximum total thickness of only about 1 $\mu$m for buried oxide layer 104.

Finally, an approach of electrically floating rather than grounding substrate 106 has been offered. This approach has shown some effectiveness for active devices at moderate frequencies. However, physically larger inductors and other passive circuit elements still exhibit parasitic capacitance and associated losses, particularly at higher frequencies. Substrate 106 effectively constitutes a common potential plane having nodes that capacitively couple the various circuit elements together, particularly as frequencies increase. Thus, substrate 106, although floating electrically at low frequencies, may not be effectively floating at high frequency. Losses also increase at high frequency, as the impedance associated with parasitic capacitance becomes increasingly resistive.

Conventional SOI technologies, therefore, have been found to offer a less than optimal solution for the remaining parasitic capacitance and its associated loss. Hence, it would be desirable to provide a method and structure that significantly reduce parasitic capacitance between circuit elements, particularly passive devices and interconnects. Such a method should be inexpensive, easy to implement without adding significant process complexity, and not detrimental to yields.

SUMMARY

The present invention provides silicon-on-insulator (SOI) structures and methods of forming thereof, that provide reduced parasitic capacitance. In one embodiment, regions of reduced parasitic capacitance are provided for passive circuit elements such as inductors, capacitors, and interconnects. In other embodiments the entire circuit is provided with a reduced parasitic capacitance structure.

In a SOI structure of the present invention, a doped region within a silicon substrate is provided directly adjacent and underlying an isolation layer. The doped region is formed using a dopant having a conductivity type opposite that of the silicon substrate. In this manner, a junction is formed at the lower boundary of the doped region with the silicon substrate. When appropriately biased, this doped region extends the effective width of the isolation layer, thus reducing parasitic capacitance between the substrate and circuit elements. Electrical coupling for applying the bias voltage can be accomplished in several different manners. For example, in some embodiments in accordance with the present invention, electrical coupling is through the back of the substrate. In other embodiments, the electrical coupling is accomplished by forming one or more direct contacts to the doped regions. A high impedance biasing method is found to be advantageous.

Reducing parasitic capacitance increases the circuit "Q" factor, and thus reduces associated circuit losses. Additionally, reducing parasitic capacitance enhances the performance and predictability of circuit operation. These benefits become particularly important at high frequencies, such as those encountered in wireless RF communication and high speed microcomputer applications.

It has been found to be advantageous for the depletion layer to be as wide as possible. Consequently the doped layer should have uniform doping concentration and a gradual junction region with the substrate. In some embodiments, the doped layer is formed by ion implantation. In some embodiments employing ion implantation, a blanket implant is performed prior to forming any active devices in the active semiconductor layer. As an example, the doped region is formed by a process including implantation of phosphorus P+ ions with an implantation energy in a range of approximately 300 Kev to 500 Kev and with a dose of approximately $10^{12}$ ions per $cm^2$.

In other embodiments, a patterned ion implantation is performed. In some embodiments employing a patterned ion implantation, the implantation is performed through a mask, before forming devices or other elements in the active semiconductor layer. In other embodiments employing a patterned ion implantation, the implantation is performed after forming devices or other elements in the active semiconductor layer.

In further embodiments, the doped region is formed in the silicon substrate of a partially formed SOI wafer. In one embodiment, the doped region is formed in the silicon substrate, after the isolation layer is formed but before the active semiconductor layer is formed. In other embodiments, the doped region is formed in the silicon substrate, before the isolation layer is formed. In some embodiments a dopant is thermally diffused directly into the silicon substrate, prior to forming an isolation layer or active semiconductor layer.

In some embodiments, formation of the doped region includes an annealing process. In some embodiments the doped region is formed by a combination including one or more of the above methods.

BRIEF DESCRIPTION OF THE DRAWINGS

The present invention may be better understood, and its numerous objects, features, and advantages made apparent by referencing the accompanying drawings. For ease of understanding and simplicity, common numbering of elements within the illustrations is employed where an element is the same in different drawings.

FIG. 1A is a cross-sectional view of a conventional SOI structure;

FIG. 1B is a cross-sectional view schematically illustrating a conventional passive element in a conventional SOI structure;

FIG. 1C is a cross-sectional view illustrating the SIMOX process;

FIG. 1D is a cross-sectional view illustrating a bonded-wafer process;

DETAILED DESCRIPTION OF THE EMBODIMENTS

Figure 2:
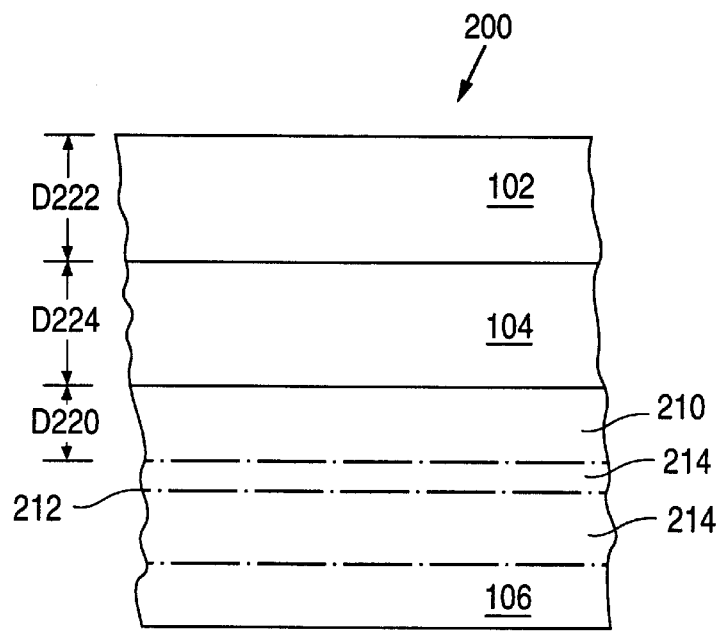
FIG. 2 is a cross-sectional view of a SOI structure, in accordance with embodiments of the present invention.

The following is a detailed description of illustrative embodiments of the present invention. As these embodiments of the present invention are described with reference to the aforementioned drawings, various modifications or adaptations of the methods and or specific structures described may become apparent. Hence, these descriptions and drawings are not to be considered in a limiting sense as it is understood that the present invention is in no way limited to the embodiments illustrated.

The present invention relates generally to integrated circuit structures and methods for the manufacture thereof, and more specifically to semiconductor-on-insulator integrated circuit structures having reduced parasitic capacitance.

Conventionally, SOI wafers such as SOI structure 100 of FIG. 1A are fabricated mainly by SIMOX (Separation by Implanted Oxygen) or by bonded-wafer methods.

FIG. 1C is a cross-sectional view illustrating a conventional SIMOX process. In a conventional SIMOX process, buried oxide layer 104 (see FIG. 1A) is created by implanting oxygen (O+) ions into a bulk silicon substrate 120, as illustrated in FIG. 1C. Implantation energies and doses are well established in the SIMOX process. In this manner, the O+ ions penetrate sufficiently deeply (typically 0.3 μm to 0.5 μm) at a high enough concentration into bulk silicon substrate 120 to form a continuous buried oxide layer 104, as shown in SOI structure 100 of FIG. 1A. In accordance with conventional integrated circuit technology, greater implantation energies produce greater implant depths and thus greater thicknesses of the overlying active semiconductor layer. To achieve other implant depths and concentrations, other appropriate implantation energies and doses can be applied.

FIG. 1D is a cross-sectional view illustrating a bonded-wafer process. In a bonded-wafer process, typically two bulk silicon wafer substrates 130 and 132 are oxidized using conventional methods, forming oxidized wafer structures 134 and 136 respectively, having respective oxide surfaces 138 and 140. Oxide surfaces 138 and 140 and then contacted together, and oxidized wafer structures 134 and 136 are fused together in a high-temperature furnace (not shown), forming a conventional SOI structure 100, as shown in FIG. 1A.

Numerous variations of the above methods have been described in the technical literature (see for example Wolf, "Silicon Processing for the VLSI Era," Vol. 2, pp. 68–78, Lattice Press, Sunset Beach, Calif., 1990).

FIG. 2 is a cross-sectional view of an SOI structure 200, in accordance with the invention, having an active semiconductor layer 102 overlying an isolation layer 104. Commonly, isolation layer 104 is a buried oxide layer, as with SOI structure 100 in FIG. 1A. Active semiconductor layer 102 generally contains doped N-type or P-type silicon (Si), and includes active and passive circuit elements, interconnects, and contact regions (not shown). Isolation layer 104 is typically formed in a substrate 106. In some embodiments, an isolation layer is formed of sapphire or other dielectric material.

A doped layer 210 is formed in substrate 106 adjacent to isolation layer 104. The conductivity type of doped layer 210 is opposite from the conductivity type of substrate 106. For example, if substrate 106 has P-type conductivity, then doped layer 210 has N-type conductivity. A typical N-type dopant is provided by phosphorus (P+) ions. An alternative N-type dopant is arsenic (As+). Conversely, substrate 106 may have N-type conductivity and doped layer 210 may have P-type conductivity, provided typically by P-type dopant boron (B– or $BF_2$–).

Of importance, a metallurgical junction 212 is formed between doped layer 210 and substrate 106. Also of importance, the doped layer width D220 of doped layer 210 allows doped layer 210 to extend deeply into substrate 106 from buried oxide layer 104.

Typically the active width D222 of active semiconductor layer 102 is of the order of approximately 200 nm, the oxide width D224 of buried oxide layer 104 is of the order of approximately 400 nm, and the doped layer width D220 of doped layer 210 is of the order of less than approximately 1,000 nm. In some embodiments, doped layer 210 is lightly doped, having a gaussian distribution profile with a concentration immediately beneath buried oxide layer 104 in a range of approximately from $10^{14}$ to $10^{15}$ ions per $cm^3$, thereby providing for a metallurgical junction 212. Implantation uniformity is typically within 5 percent across the wafer and between wafer lots.

FIGS. 3A–3E are cross-sectional views illustrating methods of forming doped layer 210 of FIG. 2, in accordance with embodiments of the present invention.

In some embodiments, formation of doped layer 210 is performed concurrently with the fabrication of a SOI wafer, as described above in connection with FIGS. 1C and 1D.

Figure 3A:
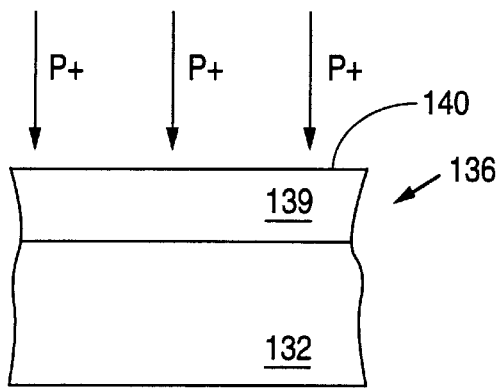
FIGS. 3A–3E are cross-sectional views illustrating methods of forming a doped layer, in accordance with embodiments of the present invention.
Figure 3B:
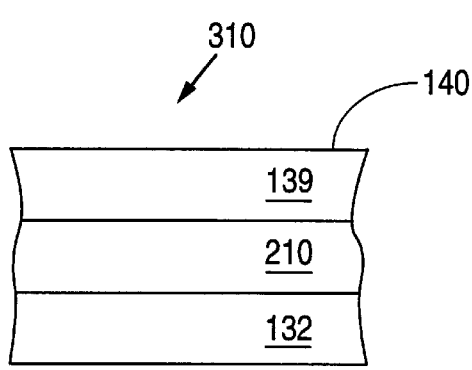

For example, FIG. 3A is a cross-sectional view showing oxidized wafer structure 136 of FIG. 1D, including a P-type silicon wafer substrate 132 and oxide layer 139 having oxide surface 140. Oxidized wafer structure 136 is subjected to a P+ phosphorus ion implantation through oxide layer 139, establishing doped layer 210 in wafer substrate 132 adjacent oxide layer 139 and forming an intermediate structure 310 as shown in FIG. 3B. Implant energies are generally in a range of approximately 80 Kev to 200 Kev. However, higher implant energy can still be used, provided that the implant-induced defects can be annealed. Intermediate structure 310 is subsequently contacted and fused conventionally to an oxidized wafer structure, such as structure 134 of FIG. 1D, forming SOI structure 200, as shown in FIG. 2.

Figure 3C:
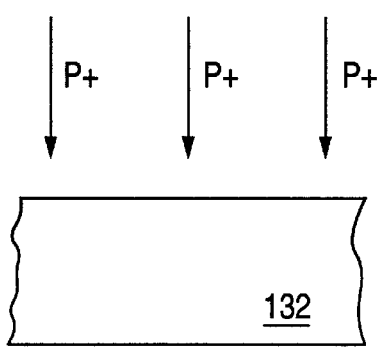
Figure 3D:
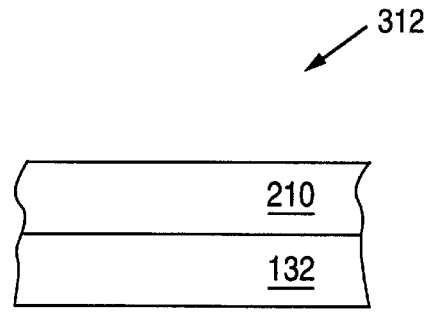
Figure 3E:
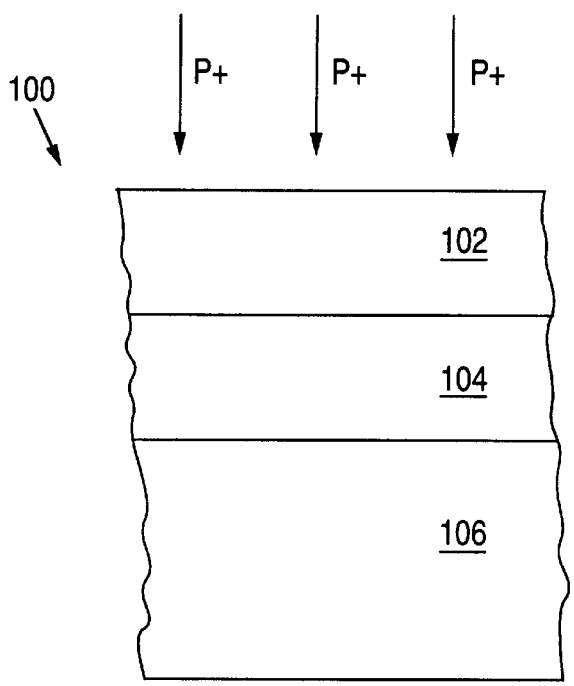

In some embodiments, as shown in FIG. 3C, doped layer 210 is formed by ion implantation (e.g. phosphorus P+) into silicon wafer substrate 132 prior to formation of oxide surface 140. Implant energies are generally in a range of approximately 30 Kev to 50 Kev, lower than the implant energies described in connection with FIG. 3A. The ion implantation of FIG. 3C forms an intermediate structure 312 as shown in FIG. 3D. Oxide surface 140 is then formed in silicon wafer substrate 132 by a SIMOX process or thermal growth, forming intermediate structure 310 of FIG. 3B. Intermediate structure 310 is conventionally bonded to oxidized wafer structure 134, forming SOI structure 200, including doped layer 210.

In some embodiments, doping of silicon wafer substrate 132 is performed before the formation of oxide surface 140 by a direct diffusion process through an exposed surface of silicon wafer substrate 132. The latter operation is performed, for example, by immersion of wafer substrate 132 into a conventional diffusion furnace. This furnace diffusion forms intermediate structure 312 as shown in FIG. 3D. Then an oxide surface 140 is grown thermally in intermediate structure 312 or formed by other methods familiar in the art, forming intermediate structure 310 as shown in FIG. 3B. Subsequently, oxide surface 140 of intermediate structure 310 is conventionally contacted and fused to oxidized structure 134, as described above in connection with FIG. 1D. The bonding process forms a SOI wafer 200 containing doped layer 210 within substrate 106, as shown in FIG. 2.

In some embodiments, doped layer 210 is formed in conventional SOI structure 100 of FIG. 1A by first performing a blanket ion implantation through active semiconductor layer 102 and buried oxide layer 104 into the region of substrate 106 immediately underlying buried oxide layer 104. In the example shown in FIG. 3E, in which substrate 106 has P-type conductivity and the implanted ion is N-type, typically phosphorus P+. This operation forms SOI structure 200, including doped layer 210, as shown in FIG. 2.

In some embodiments, it is desired to achieve a dopant layer concentration and distribution as described in connection with FIG. 2, where active semiconductor width D222 is approximately 200 nm, buried oxide width D224 is approximately of 200 nm, and the dopant is phosphorus P+ in a P-type substrate 106, respectively.

Under the above conditions, the required implant energy is generally in a range of approximately 300 Kev to about 500 Kev and the required dose is of the order of about $10^{12}$ ions per cm$^2$. Again, higher implant energy can be used, with trade-offs in processing cost and implant defects. Those of ordinary skill in the art will recognize that changes in various layer widths or dopant species will generally require corresponding changes in implant dose and/or energy. In some embodiments, ion implantation is performed in a two-step sequence, first delivering about one-half of the dose using one-half of the nominal implant energy and then delivering the remaining dose using double the nominal implant energy, to achieve a light but uniform dopant concentration, thereby improving device threshold stability by reducing the body effect.

Figure 4A:
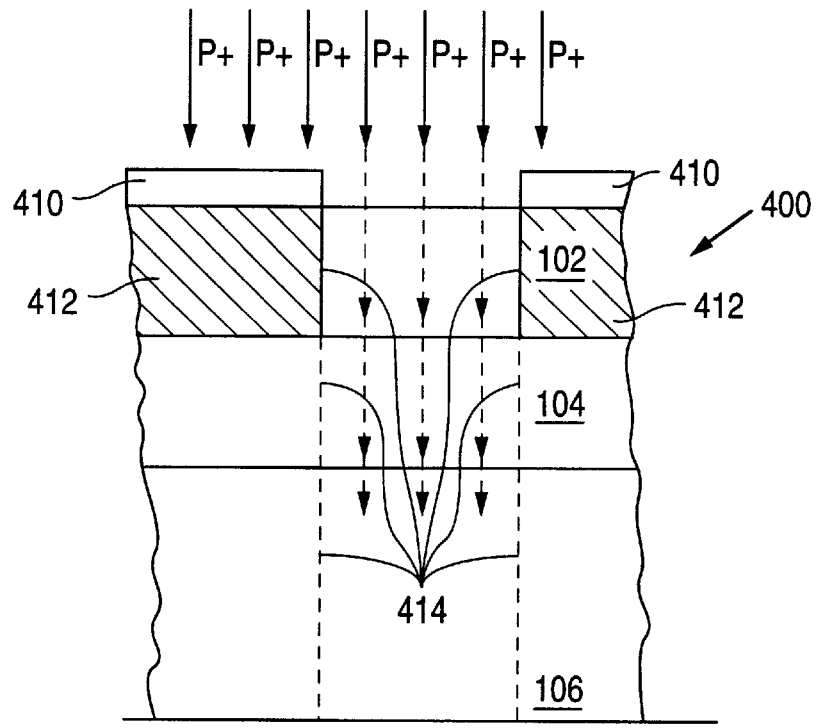
FIG. 4A is a cross-sectional view showing selective implantation into a conventional SOI structure through a mask, in accordance with embodiments of the present invention.

In some embodiments, a doped layer is formed by first performing a selective ion implantation. FIG. 4A is a cross-sectional view showing selective implantation into conventional SOI structure 100 through a mask. By patterning the implantation through a mask 410 (typically photoresist), underlying regions 412 of active semiconductor layer 102 are protected from implantation and/or associated damage. Selective implantation is performed at substantially the same implantation energy and dose for a given implant depth and concentration as described above in connection with FIG. 3E. Implantation and/or associated damage then occur only in regions 414 that are not protected by mask 410.

Figure 4B:
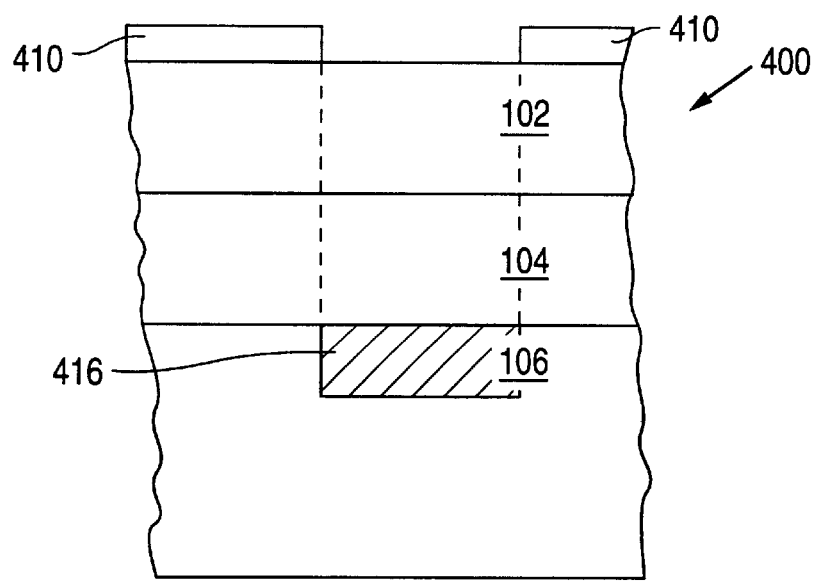
FIG. 4B is a cross-sectional view of a SOI structure including selectively doped regions, resulting from a selective implantation method, in accordance with embodiments of the present invention.

FIG. 4B is a cross-sectional view of a SOI structure 400 including selectively doped regions 416 formed in substrate 106 immediately underlying isolation layer 104, resulting from a selective implantation method. Selective implantation facilitates controlled implantation and protection of critical semiconductor regions. Those skilled in the art will recognize that selective implantation can be performed at any stage during the manufacture of SOI structure 400. In some embodiments, masking is effectively provided by previously formed structural and circuit elements in active semiconductor layer 102. These elements include, for example, field oxide regions, gate electrodes, and inductors such as inductor 152 of FIG. 1B, which protect their respective underlying regions from implantation and/or associated damage. In some embodiments, selective implantation is performed by a combination of methods including one or more of photoresist masking and structural element masking.

Forming of doped layer 210 and doped regions 416 typically includes conventional annealing processes, which spread the dopant redistribution, creating a gradual metallurgical junction 212 with substrate 106, as described above in connection with FIG. 2. Additionally, annealing removes crystal dislocations and other damage produced in the active semiconductor layer during implantation. A typical implant anneal includes exposure to temperatures in a range of approximately 950° C. to 1000° C. for about 2 hours to 4 hours.

In some embodiments, to simplify processing, the implantation and/or annealing process for formation of doped layer 210 are combined with other compatible implant and/or anneal operations, e.g. formation of deep N-wells or P-wells for MOS devices.

In some embodiments arsenic, for example, is used instead of phosphorus as an N-type dopant. However, doping concentrations, implant energies, and other parameters for arsenic are expected to differ from those for phosphorus, primarily due to lower mobility of arsenic relative to phosphorus. Particularly, arsenic is expected to require a differing anneal cycle with a greater time-temperature (DT) factor relative to phosphorus, to form a comparably uniform doped layer concentration with a comparably gradual junction.

Forming a doped layer in the substrate concurrently with fabricating the SOI wafer typically is advantageous, both physically and logistically. This method potentially provides optimal doped layer uniformity and damage annealing without unwanted side effects. The substrate is equally isolated from the entire active semiconductor layer, regardless of lateral position or subsequently formed structures.

Forming the doped layer in a finished but otherwise unmasked and unprocessed SOI wafer advantageously provides doped layer uniformity throughout the substrate and ease of implantation damage removal by annealing, using a relatively simple process in a device free environment. It can also be advantageous logistically, particularly for maintaining process control, if SOI wafers are obtained from a third party source. This method also provides uniform isolation between the substrate and all parts of the active semiconductor layer, regardless of lateral position or subsequently formed structures.

Selectively implanting doped layer 210 into a SOI wafer that is patterned with photoresist or by previously formed structural or circuit elements advantageously offers selective lateral placement of doped layer regions. For example, it facilitates formation of the depletion layer selectively under inductors and other passive elements. It also offers protection from implantation damage in potentially critical regions of the active semiconductor layer underlying photoresist or thick elements on or within the active semiconductor layer (for example, if field oxide has already grown, its thickness is approximately double that of the original silicon). With appropriate integrated circuit design, these advantages are potentially achievable concurrently. Potential disadvantages are process complexity and the possibility of adversely affecting existing circuit elements and parameters.

It is possible to reduce some process complexity by combining the formation of the doped layer with another implantation operation, e.g. implantation of phosphorus P+ ions to form deep N-wells in a P-type active semiconductor layer. However, the peak concentration depth for the doped layer is below the buried oxide, whereas the peak concentration depth for a well or other implanted region is typically above the buried oxide layer. Thus, care must be taken when combining processes that normally require substantially different conditions.

Additionally, a potential drawback of patterned implantation is the effect on active semiconductor layer regions of the anneal cycle required to homogenize the doped layer. Avoiding under-annealing or over-annealing of critical regions potentially complicates the process. For example, after the active layer structures have been formed, it could be necessary to perform several successive implant/anneal cycles into the doped layer to achieve the desired doping concentration uniformity without disrupting the active layer structures. A further potential disadvantage of patterned implantation is that some active layer elements, e.g. gate electrodes, are typically not sufficiently thick to block the high energy implantation.

In some embodiments, the doped layer is formed using a combined process including one or more of the above described methods.

Either during or after the formation and annealing of doped layer 210, as described above in connection with FIGS. 3A–3E (or doped regions 416, as described above in connection with FIGS. 4A and 4B), SOI structure 200 is further processed using conventional technology to form circuit elements in semiconductor layer 102, e.g. inductor 152, as described above in connection with FIG. 1B. Referring to FIG. 2, metallurgical junction 212 is then biased by applying voltage to the circuit elements in semiconductor layer 102. Biasing metallurgical junction 212 enlarges the depletion layer 214, extending across metallurgical junction 212 into substrate 106 as shown in FIG. 2. An extended depletion layer 214 effectively increases the width of buried oxide layer 104. Accordingly, parasitic capacitance is reduced between substrate 106 and the circuit elements in active semiconductor layer 102.

To enlarge depletion layer 214 beneath buried oxide layer 104, it is important to employ a high impedance biasing method to reverse bias metallurgical junction 212 in bulk silicon substrate 106. A low impedance bias will load down the bulk node, thereby negating at least in part the advantage of lower parasitic capacitance.

Figure 5:
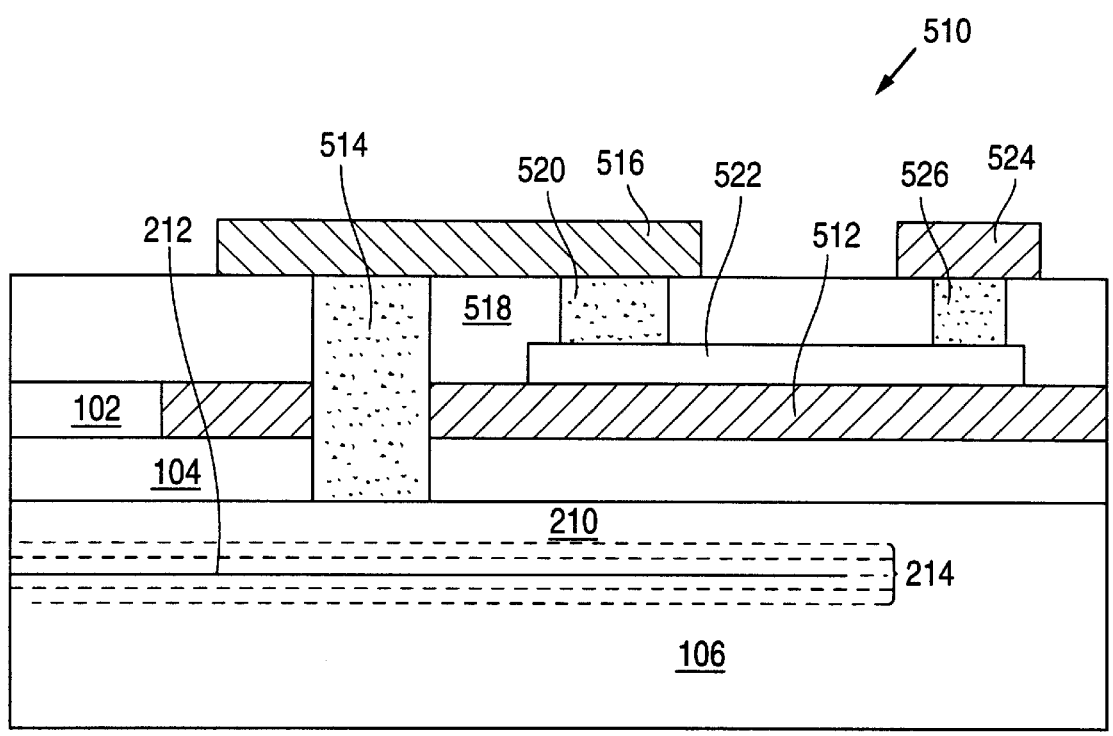
FIG. 5 is a cross-sectional view of a SOI structure including a high impedance biasing source, in accordance with an embodiment of the present invention.

FIG. 5 is a cross-sectional view of a SOI structure 510 including a high impedance biasing circuit, in accordance with an embodiment of the present invention. In SOI structure 510, an active semiconductor layer 102 overlies a buried oxide layer 104. Beneath buried oxide layer 104 is a doped layer 210, forming a metallurgical junction 212 with a bulk substrate 106. For example, doped layer 210 has N-type conductivity in a P-type substrate 106, or alternatively doped layer 210 has P-type conductivity in an N-type substrate 106. A depletion layer 214 is formed extending across metallurgical junction 212. Overlying buried oxide layer 104 and adjacent active semiconductor layer 102 is a field oxide region 512. A conducting contact plug 514 connects doped layer 210 through an opening in field oxide region 512 and buried oxide layer 104 to a metal contact region 516 overlying a dielectric layer 518 above field oxide region 512. Another contact plug 520 connects metal contact region 516 through an opening in dielectric layer 518 to one end of a resistor 522 (typically polysilicon). The other end of resistor 522 is connected to another metal contact region 524 by a third contact plug 526 through an opening in dielectric layer 518.

Connecting metal contact region 524 to a voltage source (not shown) applies a high impedance bias through resistor 522 to metallurgical junction 212, thereby extending depletion layer 214 deeper into substrate 106 and reducing parasitic capacitance. The value or precision of resistor 522 is not critical, and hence resistor 522 can be made geometrically small, of the order of the device minimum gate width.

In other embodiments, an active high impedance bias source, for example a current source, can be used.

Figure 6A:
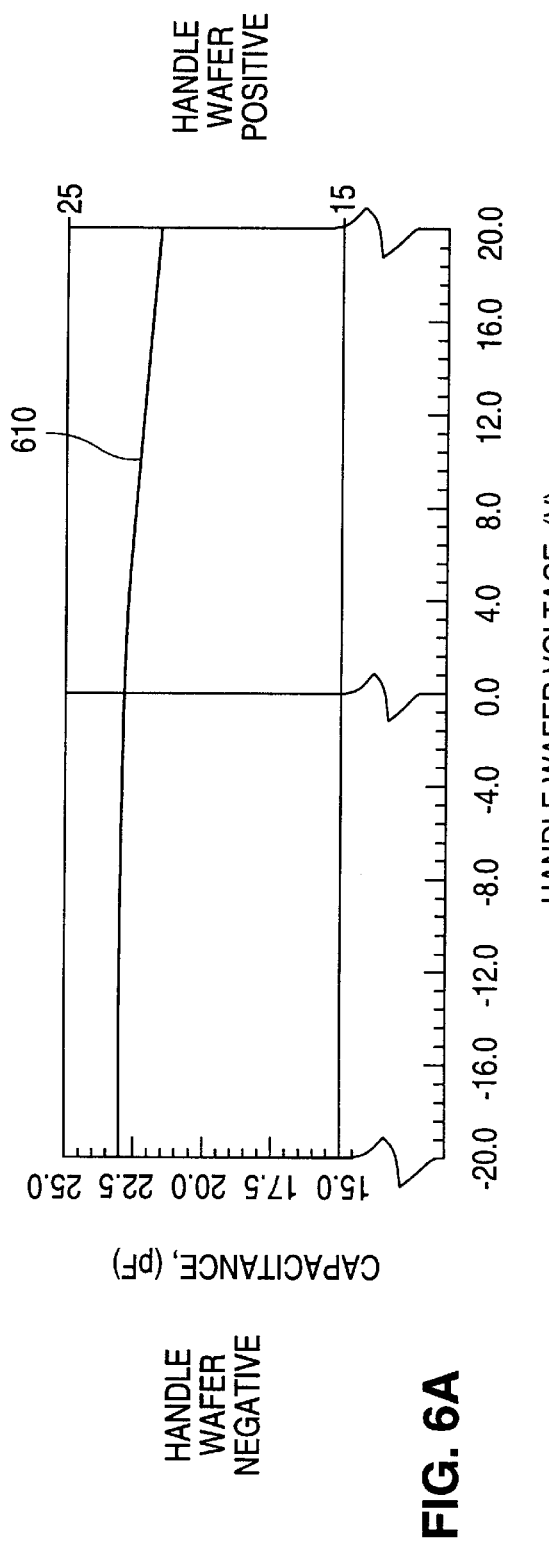
FIGS. 6A and 6B are graphic representations of the parasitic capacitance relative to bias voltage for various SOI structures, in accordance with embodiments of the present invention.
Figure 6B:
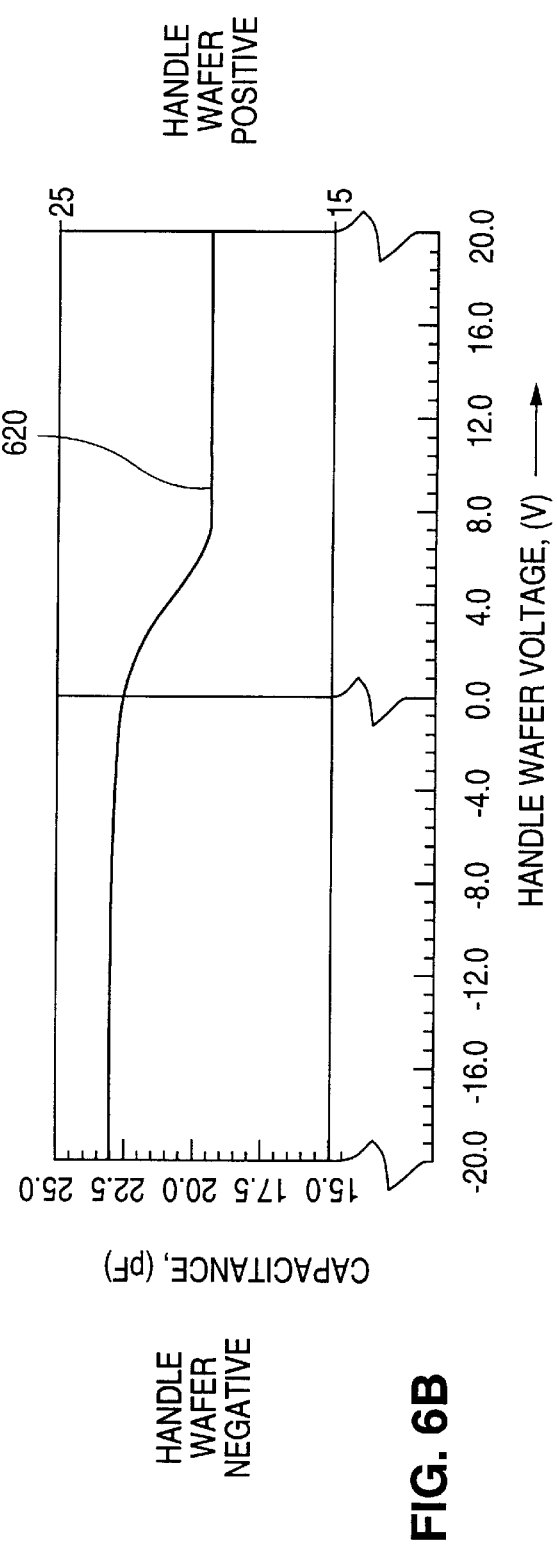

FIGS. 6A and 6B are graphic representations of the parasitic capacitance relative to bias voltage in various SOI structures. FIG. 6A shows the parasitic capacitance 610 as a function of bias voltage for a conventional SOI structure similar to SOI structure 100. As the bias voltage increases from −20 volts to +20 volts, there is a small but observable decrease in parasitic capacitance 610. FIG. 6B shows the parasitic capacitance 620 as a function of bias voltage for a prototype SOI structure similar to SOI structure 200, including doped layer 210. As the bias voltage increases from −20 volts to +20 volts, a substantial reduction in parasitic capacitance 620 occurs above a bias threshold of between approximately zero volts and 5 volts. Therefore, with appropriate biasing, a SOI structure in accordance with the invention exhibits appreciably reduced parasitic capacitance relative to a conventional SOI structure.

To reduce parasitic capacitance in a SOI structure in accordance with the invention, it has been found to be important to create a depletion layer within the substrate, underlying and adjacent the buried oxide layer. It has further been found preferable that this depletion layer be as wide as possible, to effectively extend the width of the buried oxide layer. To accomplish this, it is of importance to form a doped layer in the substrate underlying and adjacent the buried oxide layer, having a conductivity type opposite the conductivity type of the substrate, e.g. N-type doped layer for a P-type substrate and P-type doped layer for an N-type substrate. It has been found that this doped layer should have a substantially uniform doping concentration above a required threshold concentration and should form a gradual junction with the substrate.

When appropriately biased above a threshold voltage, the depletion layer associated with this junction extends deeper into the substrate, thereby increasing the effective width of the buried oxide layer. This increased effective width reduces parasitic capacitance between the substrate and circuit elements in the overlying active semiconductor layer. In embodiments of the invention, reductions of the order of 50 percent in bulk parasitic capacitance relative to that of normal SOI structures of the order of 50 percent are obtainable.

Reducing SOI parasitic capacitance for inductors, interconnects, and other elements as described above increases the circuit "Q" factor, and thereby reduces associated substrate loss. Additionally, reducing parasitic capacitance enhances performance and predictability of circuit operation by stabilizing the ratio of parasitic capacitance to design capacitance. These improvements become increasingly important at high frequencies typically encountered in modern wireless communication and high speed digital applications. Quantitative improvements in device and circuit performance provided according to the present invention are variable, depending on circuit design details. In accordance with the present invention, these benefits are achieved without complex structures or processes. The only required additional process step is a dopant implant into the substrate.

While embodiments of the present invention have been shown and described, it will be obvious to those skilled in the art that changes and modifications to these illustrative embodiments can be made without departing from the present invention in its broader aspects. Thus it should be evident that there are other embodiments of this invention which, while not expressly described above, are within the scope and spirit of the present invention. Therefore, it will be understood that the appended claims necessarily encompass all such changes and modifications as fall within the described invention's true scope and spirit; and further that this scope and spirit is not limited merely to the illustrative embodiments presented to demonstrate that scope and spirit.

What is claimed is:

1. A method of reducing parasitic capacitance in a semiconductor-on-insulator structure, comprising:

forming a silicon substrate, said silicon substrate having a first conductivity type;

forming an isolation layer, said isolation layer overlying said silicon substrate;

forming a semiconductor layer, said semiconductor layer overlying said isolation layer;

forming a doped region within said silicon substrate, said doped region having a second conductivity type opposite said first conductivity type and being adjacent said isolation layer, said doped region and said silicon substrate forming a metallurgical junction and a depletion layer therebetween; and forming a high impedance bias circuit for biasing said doped region above said doped region, said high impedance bias circuit including a conductor plug over said doped region coupled to receive a bias voltage.

2. The method of claim 1, wherein said doped region is formed by a process including ion implantation.

3. The method of claim 1, wherein said doped region is formed by a process including thermal diffusion.

4. The method of claim 1, wherein said doped layer is formed by a process including annealing.

5. The method of claim 1, wherein said first conductivity type is N-type.

6. The method of claim 1, wherein said first conductivity type is P-type.

7. The method of claim 6, wherein said doped region comprises a material selected from the group consisting of phosphorus and arsenic.

8. The method of claim 1, further comprising forming at least one passive circuit element in said semiconductor layer.

9. The method of claim 8, wherein said at least one passive circuit element includes an element selected from the group consisting of an inductor, a capacitor, and an interconnect.

10. The method of claim 2, wherein said doped region is formed by a process including implantation of phosphorus P+ ions with an implantation energy in a range of approximately from 300 Kev to 500 Kev and with a dose of approximately $10^{12}$ ions per $cm^2$.

11. The method of claim 1, wherein said forming of said doped region occurs before said forming of said isolation layer.

12. The method of claim 1, wherein said forming of said doped region occurs after said forming of said isolation layer and before said forming of said semiconductor layer.

13. The method of claim 8, wherein said forming of said doped region occurs after said forming of said semiconductor layer and before said forming of said at least one passive circuit element.

14. The method of claim 8, wherein said forming of said doped region occurs after said forming of said semiconductor layer and after said forming of said at least one passive circuit element.

15. The method of claim 2, wherein said ion implantation comprises:

patterning said semiconductor-on-insulator structure selectively with a mask; and performing a selective ion implantation through said mask.

16. The method of claim 1, wherein said high impedance bias circuit comprises a current source.

17. The method of claim 1, wherein said high impedance bias circuit further comprises a resistor having a first terminal electrically connected to said conductor plug and a second terminal connectable to receive said bias voltage.

18. The method of claim 17, wherein said resistor comprises polysilicon.

19. The method of claim 17, wherein said forming a high impedance bias circuit comprises:

selectively forming a field oxide region above said semiconductor layer;

selectively providing a polysilicon layer above said field oxide region; and forming said resistor from said polysilicon layer.

20. The method of claim 17, wherein said forming a high impedance bias circuit comprises:

forming an insulative layer above said semiconductor layer;

selectively removing portions of said insulative layer, said semiconductor layer and said isolation layer to expose a surface of said doped region; and forming said conductor plug extending from a surface of said insulative layer to said exposed surface of said doped region.

* * * * *